United States Patent
Ha et al.

(10) Patent No.: US 8,050,083 B2
(45) Date of Patent: Nov. 1, 2011

(54) PHASE CHANGE MEMORY DEVICE AND WRITE METHOD THEREOF

(75) Inventors: Dae-Won Ha, Seoul (KR); Jung-Hyuk Lee, Hwaseong-si (KR); Gi-Tae Jeong, Seoul (KR); Hyeong-Jun Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 89 days.

(21) Appl. No.: 12/320,963

(22) Filed: Feb. 10, 2009

(65) Prior Publication Data
US 2009/0201721 A1     Aug. 13, 2009

(30) Foreign Application Priority Data
Feb. 11, 2008  (KR) .................. 10-2008-0012292

(51) Int. Cl.
*G11C 11/00*     (2006.01)

(52) U.S. Cl. ............... 365/163; 365/148; 365/189.14; 365/189.16; 365/226

(58) Field of Classification Search ................. 365/163, 365/148, 189.14, 189.16, 226
See application file for complete search history.

(56) References Cited

U.S. PATENT DOCUMENTS

| | | | |
|---|---|---|---|
| 7,286,401 B2 | 10/2007 | Ishimaru et al. | |
| 7,391,643 B2 | 6/2008 | Fuji | |
| 2005/0117387 A1* | 6/2005 | Hwang et al. | 365/163 |
| 2006/0056234 A1* | 3/2006 | Lowrey | 365/163 |
| 2006/0158948 A1 | 7/2006 | Fuji | |
| 2007/0217253 A1* | 9/2007 | Kim et al. | 365/163 |
| 2009/0003034 A1* | 1/2009 | Happ et al. | 365/148 |

FOREIGN PATENT DOCUMENTS

| | | |
|---|---|---|
| JP | 2005-182909 A | 7/2005 |
| JP | 2006-202383 A | 8/2006 |
| JP | 2006-221691 A | 8/2006 |

* cited by examiner

*Primary Examiner* — Pho M Luu
*Assistant Examiner* — Thao Bui
(74) *Attorney, Agent, or Firm* — Lee & Morse, P.C.

(57) ABSTRACT

A phase change memory device and a write method thereof allow writing of both volatile and non-volatile data on the phase change memory device. The phase change memory device may be written by setting a write mode as one of a volatile write mode and a non-volatile write mode, and writing data as volatile or non-volatile by applying a write pulse corresponding to the write mode, wherein, when power is not supplied to the phase change memory device, the non-volatile data is retained and the volatile data is not retained.

16 Claims, 8 Drawing Sheets

Fig. 11

PHASE CHANGE MEMORY DEVICE AND WRITE METHOD THEREOF

BACKGROUND

1. Field

Embodiments relate to a semiconductor memory device. More particularly, embodiments relate to a phase change memory device and a write method thereof.

2. Description of the Related Art

A memory semiconductor device is classified into a volatile semiconductor memory device and a non-volatile semiconductor memory device based on whether or not power supply is required to maintain stored information.

A volatile memory device, e.g., a dynamic random access memory (DRAM), a static random access memory (SRAM), etc., has a fast operating speed but needs to be supplied with a power source to maintain stored information. A non-volatile memory device, e.g., a read only memory (ROM), a flash memory, etc., does not have the above-mentioned power supply limitation but has a slow programming speed. Accordingly, a new kind of a memory device is on demand for overcoming various limitations of a currently used memory device.

In view of miniaturization/portability trends of electronic products and prices of semiconductor products, a new kind of a memory device needs to be developed in order to satisfy a variety of technical requirements, including non-volatility, low power consumption, fast operating speed, and high integration. Next generation memory device potentially satisfying the above technical requirements include a phase change memory (PRAM) device, a magnetic random access memory (MRAM) device, and a ferroelectric random access memory (FeRAM) device. In particular, the PRAM device does not have technical difficulties that may occur during a formation of a phase change alloy thin film. Thus, the PRAM device can be manufactured at a lower cost. Additionally, the PRAM device has prolonged product durability, as information stored therein may be modified more than about $10^{13}$ times, and a fast operating speed.

SUMMARY

Embodiments are therefore directed to a phase change memory device capable of writing volatile and non-volatile data, and a writing method thereof, which substantially overcome one or more of the disadvantages of the related art.

It is therefore a feature of an embodiment to provide a phase change memory device having a fast writing speed and a writing method thereof.

It is therefore another feature of an embodiment to provide a phase change memory device having low power consumption and a writing method thereof.

At least one of the above and other features and advantages may be realized by providing write methods of a phase change memory device including setting a write mode as one of a volatile write mode and a non-volatile write mode, and writing data as volatile or non-volatile on a phase change memory cell of the phase change memory device by applying a write pulse corresponding to the write mode, wherein, when power is not supplied to the phase change memory device the non-volatile data is retained and the volatile data is not retained.

In some embodiments, writing data may include writing non-volatile data by applying a first write pulse in the non-volatile write mode and writing volatile data by applying a second write pulse in the volatile write mode, the second write pulse having a shorter applying time than the first write pulse.

In other embodiments, writing volatile data may include rewriting written volatile data after a predetermined time.

In still other embodiments, rewriting written volatile data may include applying a third write pulse, the third write pulse having a shorter applying time than the second write pulse.

In even other embodiments, the method may include varying at least one of a width and an applying period of the third write pulse according to a number of times rewriting written volatile data has been repeated.

In yet other embodiments, applying times of the first to third write pulses may be determined by at least one of types, component ratios, and doping methods of a phase change material included in the phase change memory cell.

In further embodiments, rewriting written volatile data may include initializing a counter, measuring time using the counter, sensing written volatile data when the measured time elapses by a predetermined time; and rewriting the sensed data by using the third write pulse.

In still further embodiments, the methods may further include monitoring a capacity of a battery, the battery supplying power to the phase change memory device, and rewriting written volatile data as non-volatile data if the capacity of the battery is below a predetermined level.

At least one of the above and other features and advantages may be realized by providing phase change memory devices including an array including a plurality of phase change memory cells, a control logic configured to generate one of a first write pulse and a second write pulse, the first write pulse writing data as non-volatile data on a phase change memory cell, the second write pulse writing data as volatile data on the phase change memory cell, and a write read circuit configured to apply one of the first and second write pulses to the phase change memory cell in response to an output of the control logic, wherein, when power is not supplied to the phase change memory device the non-volatile data is retained and the volatile data is not retained.

In some embodiments, the second write pulse may have a shorter applying time than the first write pulse.

In other embodiments, the control logic may be configured to generate a third write pulse, the third write pulse rewriting written volatile data after a predetermined time.

In still other embodiments, the write read circuit may be configured to sense written volatile data in response to an output of the control logic and rewrite the sensed data on the phase change memory cell by applying the third write pulse.

In even other embodiments, the third write pulse may have a shorter applying time than the second write pulse.

In yet other embodiments, the controller may be configured to vary at least one of a width and an applying period of the third pulse according to a number of times rewriting written volatile data has been repeated.

In further embodiments, applying times of the first to third write pulses may be determined by at least one of types, component ratios, and doping methods of a phase change material included in the phase change memory cell.

In still further embodiments, the control logic may be configured to manage mapping information of data written in the phase change memory device and control rewriting written volatile data based on the mapping information.

In even further embodiments, the phase change memory cell may include a phase change material of GST, the GST including a composition of Ge, Te, and Sb.

In yet further embodiments, the phase change memory cell may include a combination of at least one of Te and Se and at least one of Ge, Sb, Bi, Pb, Sn, Ag, As, S, Si, P, O, and N.

In yet further embodiments, the phase change memory cell may include a combination of at least one of Ge—Sb—Te, As—Sb—Te, As—Ge—Sb—Te, Sn—Sb—Te, Ag—In—Sb—Te, In—Sb—Te, 5A-group element-Sb—Te, 6A-group-Sb—Te, 5A-group element-Sb—Se and 6A-group element-Sb—Se.

In yet further embodiments, the control logic may be configured to control rewriting written volatile data as non-volatile data if a capacity of a battery is less than a predetermined level, the battery supplying a power source to the phase change memory device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0012292, filed on Feb. 11, 2008, in the Korean Intellectual Property Office, and entitled: "Phase Change Memory Device, Write Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

A phase change memory device of embodiments may adjust an applying time of a write current in order to write volatile or non-volatile data therein. If volatile data are stored in a memory cell, an operation for rewriting corresponding data may be repeated periodically for data retention. An applying time of a write current may be variously configured according to at least one of a type, a component ratio, and a doping method of a phase change material in the phase change memory device. When data are written as volatile, the phase change memory device may rewrite stored data at a predetermined time.

As used herein, "volatile data" is to mean data that is lost when power is no longer supplied to the phase change memory device, and may require rewriting after a relatively short period of time, e.g., less than an hour. "Non-volatile data" is to mean data that is not lost when power is no longer supplied to the phase change memory device and may be retained indefinitely.

During a rewrite operation, an applying time, i.e., width of a write current may be short and an applying period, i.e., time between applications, of a write current may be long. Accordingly, during the rewrite operation, the phase change memory device may have a fast data writing speed and low power consumption.

Structures and operations of the phase change memory device will be described with reference to the accompanying drawings, but embodiments are not limited thereto.

Figure 1:
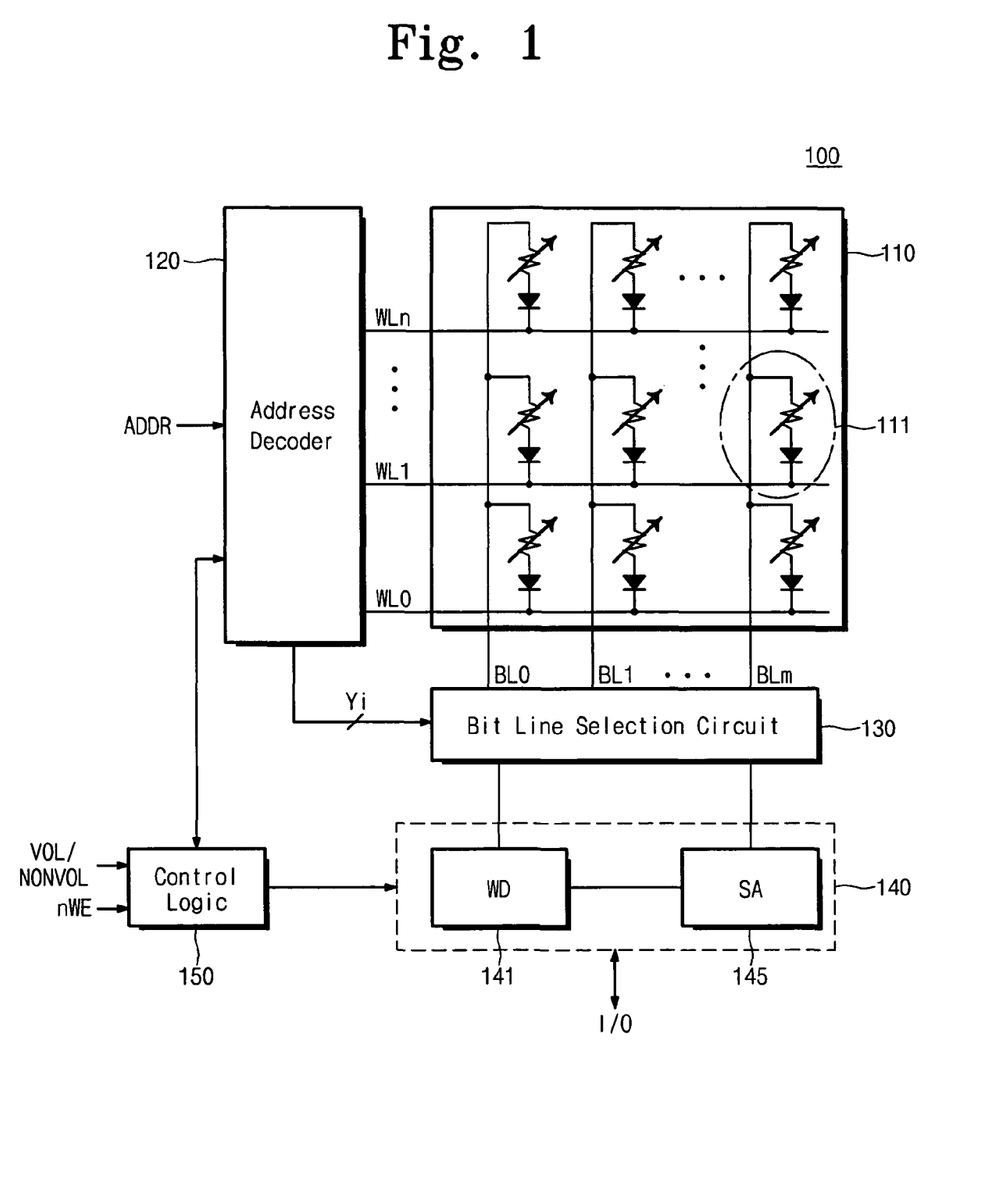
FIG. 1 illustrates a block diagram of a structure of a phase change memory device according to an embodiment.

FIG. 1 illustrates a block diagram of a structure of a phase change memory device according to an embodiment. Referring to FIG. 1, the phase change memory device 100 may include a memory cell array 110, an address decoder 120, a bit line selection circuit 130, a read and write circuit 140, and a control logic 150. The write read circuit 140 may include a write driver (WD) 141 and a sense amplifier (SA) 145.

The memory cell array 110 may include a plurality of phase change memory cells. The phase change memory cells may be arranged on intersections of rows (or word lines) and columns (or bit lines). Each of the phase change memory cells constituting the memory cell array 110 may store N-bit data information (N is equal to or greater than 1).

As described in more detail below, each of the phase change memory cells may store data to be volatile or non-volatile. A memory cell of the same type may be used for storing volatile or non-volatile data. That is, embodiments may selectively perform a volatile data write operation and a non-volatile data write operation using a phase change memory cell of the same structure.

An area including memory cells where volatile data are stored (hereinafter, referred to as a volatile data storage area) and an area including memory cells where non-volatile data are stored (hereinafter, referred to as non-volatile data storage area) may be separated from each other. Sizes of the volatile data storage area and the non-volatile data storage area may be fixed or may be configured to allow variation. In an implementation, the volatile data storage area and the non-volatile data storage area may not be divided into two separate areas, but may be uniformly distributed in the memory cell array 110.

Figure 2:
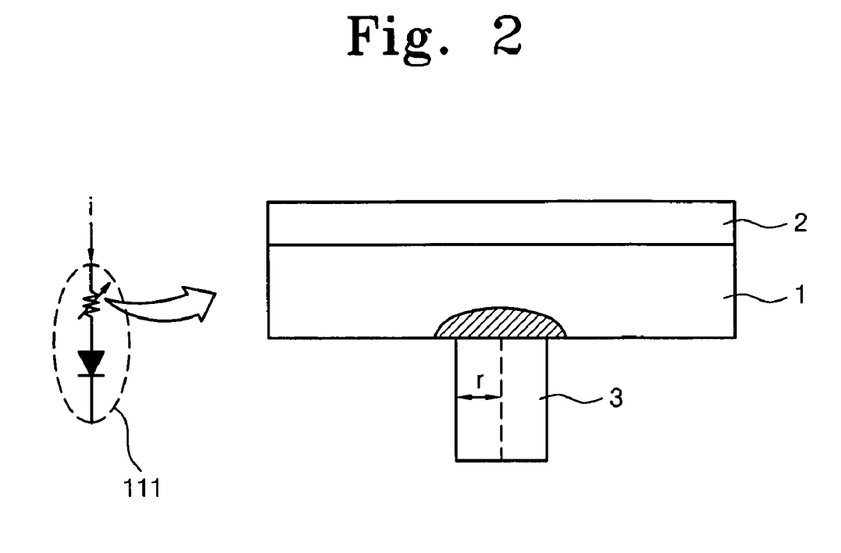
FIG. 2 illustrates a cross-sectional view of a structure of the phase change memory cell of FIG. 1 according to an embodiment.

Each phase change memory cell may have a structure as illustrated in FIG. 2. FIG. 2 illustrates a cross-sectional view of a structure of the phase change memory cell 111 of FIG. 1.

Referring to FIG. 2, a phase change memory cell 111 may include a switching device and a resistance device. In FIG. 2, a switching device including a diode is used for illustration. The switching device may be realized using various devices, e.g., a MOS transistor, besides the diode. The resistance device may include a phase change layer 1 formed of a phase change material, an upper electrode 2 formed on the phase change layer 1, and a lower electrode 3 formed below the phase change layer 1. The phase change material may have two stable states, e.g., an amorphous state and a crystalline state.

Figure 3:
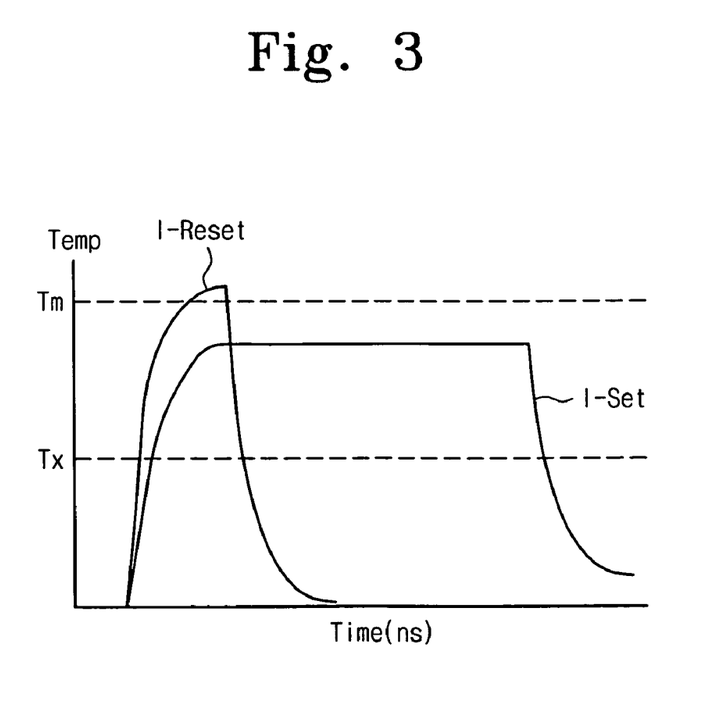
FIG. 3 illustrates a graph of a phase change characteristic according to a temperature of a phase change memory device.

FIG. 3 illustrates a graph of a phase change characteristic according to temperature and time of heating a phase change memory device. In FIG. 3, an x-axis represents time and a y-axis represents temperature.

An amorphous state of a phase change material may be achieved by heating a phase change material above a melting temperature Tm and rapidly cooling it down. A crystalline state may be achieved by heating the phase change material above a crystallization temperature Tx over a predetermined time, and then cooling it down. A case where a state of the phase change material changes from an amorphous state into a crystalline state is defined as SET, and a case where a state of the phase change material changes from a crystalline state into an amorphous state is defined as RESET.

The phase change material has a relatively high resistivity in an amorphous state and has a relatively low resistivity in a crystalline state. A value written (or programmed) with a high resistivity may represent a data value 1 (i.e., a reset state) and a value written (or programmed) with a low resistivity may represent a data value 0 (i.e., a set state). A data state written in a memory cell can be detected by detecting a difference of an amount of a current flowing through the phase change material.

Once a pulse is applied to a memory cell, the pulse flows through the lower electrode 3 of the resistance device illustrated in FIG. 2. For example, when a pulse of about tens ns is applied to a memory cell, only the portion of the phase change layer 1 adjacent to the lower electrode 3 is heated by joule heating. At this point, due to a difference of a heating profile, a portion of the phase change layer 1, represented by a hatched portion of FIG. 2, is in a crystalline state (i.e., a SET state) or an amorphous state (i.e., a RESET state).

Methods of heating the phase change layer 1 include using a laser beam and using an electrical current. Use of an electrical current allows for simpler realization of a memory chip. As described in detail below, the phase change memory device 100 may write volatile or non-volatile data on the phase change memory cell 111 by adjusting a length of time a current is applied to write data on a memory cell.

The phase change memory 111 having both volatile and non-volatile write characteristics may be realized with various methods through modifications of a type, a component ratio, and a doping method of a phase change material constituting the phase change memory device. For example, the phase change layer 1 of a phase change memory cell according to an embodiment may include GST, which is a compound of well-known phase change materials Ge, Te, and Sb. In other implementations, the phase change layer 1 may include a compound of at least one selected among Te and Se and at least one among Ge, Sb, Bi, Pb, Sn, Ag, As, S, Si, P, O, and N. For example, the phase change material constituting the phase change layer 1 may include Ge—Sb—Te, As—Sb—Te, As—Ge—Sb—Te, Sn—Sb—Te, Ag—In—Sb—Te, In—Sb—Te, 5A-group element-Sb—Te, 6A-group-Sb—Te, 5A-group element-Sb—Se or 6A-group element-Sb—Se. The data retention characteristic of the phase change memory device 100 may be improved by changing types, component ratios or doping methods of the phase change material. Accordingly, the phase change memory 111 may satisfy operating characteristics that various kinds of applications require.

Referring to FIG. 1, the address decoder 120 may perform a decoding function for decoding an address ADDR input from the external and a switching function for selecting word lines WL0 to WLn and bit lines BL0 to BLm corresponding to an address decoded result in response to a control of the control logic 150. The address ADDR may be divided into a row address RA for selecting the word lines WL0 to WLn and a column address CA for selecting the bit lines BL0 to BLm.

Corresponding memory cells may be selected through the selected word line and bit lines. For example, one memory cell 111 may be selected when the word line WL and the bit line BLm are selected.

The bit line selection circuit 130 may select a bit line in response to a select signal Yi (i=0 to m) provided from the address decoder 120. The bit line selection circuit 130 may include a plurality of switching transistors (not shown). The switching transistor may connect the bit lines BL0 to BLm with a data line. The data line may be connected between the bit line selection circuit 130 and the write read circuit 140. For example, when the select signal Ym is enabled, the bit line BLm and the data line may be electrically connected to each other.

The write read circuit 140 may perform an operation for writing data on the selected memory cell 111 and an operation for detecting the data written in the memory cell 111 in response to a pulse output by the control logic 150. As noted above, the write read circuit 140 may include the write driver 141 and the sense amplifier 145.

The write driver 141 may provide a reset current I-RESET or a set current I-SET to the selected memory cell 111 in response to a pulse from the control logic 150 when a write enable signal nWE is activated. Whether a reset current I-RESET or a SET current I-SET is provided to the memory cell 111 may be determined in accordance with a data value that to be written. The reset current I-RESET may be applied when data 1 is written on the memory cell 111 and the set current I-SET may be applied when data 0 is written on the memory cell 111. The reset current I-RESET and the set current I-SET may be generated by a reset pulse RSP and a set pulse SP, which may be by from the control logic 150 during a write operation. The reset pulse RSP and the set pulse SP both are "write pulses," and are discussed in detail below with reference to FIGS. 4 through 6.

When data 1 to be written to a memory cell 111, the write driver 141 may receive the reset pulse RSP having a predetermined current value from the control logic 150 and may provide a reset current I-RESET to the memory cell 111. Likewise, when data 0 is to be written on a memory cell 111, the write driver 141 may receive the set pulse SP having a predetermined current value from the control logic 150 and may provide a set current I-SET to a memory cell. The reset pulse RSP and the set pulse SP provided to the write driver 141 during a write operation may be generated by a pulse generation circuit (not shown) in the control logic 150.

A write operation performed in the write driver 141 may have two modes, i.e., may have a volatile write mode VOL for writing volatile data to a memory cell 111 and a non-volatile write mode NONVOL for writing non-volatile data to a memory cell 111. Data written in the non-volatile write mode NONVOL are not erased even if power supply is cut off. In contrast, data written in the volatile write mode VOL may be lost after a predetermined time elapses. To prevent this loss, an operation for rewriting data may be performed on the stored volatile data within a predetermined time period. In the volatile write mode VOL, an operation (hereinafter, referred to as a first write operation) for writing volatile data and an operation (hereinafter, referred to as a second write operation) for rewriting the rewritten volatile data may be performed simultaneously.

According to the type of write mode, times and periods of when a set pulse SP and a reset pulse RSP generated from the control logic 150 are applied may differ. For example, an applying time of set pulses and reset pulses applied during a second write operation of a volatile write mode VOL may be shorter than an applying time of set pulses and reset pulses applied during a first write operation of a volatile write mode VOL. Additionally, an applying time of a set pulse and a reset pulse applied during the first write operation of the volatile write mode VOL may be shorter than an applying time of a set pulse and a reset pulse applied during a non-volatile write mode NONVOL. Examples of a set pulse SPj and a reset pulse RSPj (where j is a positive integer) according to a write mode are described in detail later with reference to FIGS. 4 through 6.

Furthermore, a data path to the write driver 141 may vary according to write mode type. For example, write data provided to the write driver 141 in the non-volatile write mode NONVOL may be externally provided through a buffer (not shown). Additionally, write data provided to the write driver 141 for performing a first write operation of the volatile write mode VOL may also be externally provided through the buffer (not shown). However, write data provided to the write driver 141 for performing a second write operation of the volatile write mode VOL may be provided through the sense amplifier 145 in the phase change memory device 100.

The sense amplifier 145 may detect data written to a memory cell through selected bit lines in response to a control of the control logic 150. The sense amplifier 145 may perform a normal read operation and a read operation for rewriting. Data detected by the sense amplifier 145 during a normal read operation may be externally output, e.g., to a memory controller or a host, through the buffer. Data read during the normal read operation may include volatile data and non-volatile data. Data detected during a read operation for rewriting may be provided to the write driver 141 in the phase change memory device 100 instead of being provided to the outside. The write driver 141 may perform a rewrite operation according to the detected data provided from the sense amplifier 145. The rewrite operation may be repeatedly performed at a predetermined time period.

The control logic 150 may control general operations of the phase change memory device 100 in response to a read/write command input from the outside. A pulse generation circuit (not shown) in the control logic 150 may generate a set pulse SPj and a reset pulse RSPj (j is a positive integer) applied in the volatile write mode VOL and the non-volatile write mode NONVOL. The write operation performed in the volatile write mode VOL may include the above-mentioned first and second write operations.

Additionally, the control logic 150 may perform mapping of a logical address and a physical address of volatile/non-volatile data using a translation layer, and may manage a mapping result. A rewrite operation for the written volatile data may be controlled using the mapping result. The translation layer may be realized with separate hardware and/or a device driver.

The resistivity of the phase change layer 1 corresponding to a crystalline state and the resistivity of the phase change layer 1 corresponding to an amorphous state may be greater or less than a preferred resistivity due to various factors. One of the factors that make the resistivity differ from the preferred resistivity is heat applied to the phase change layer 1. Heat applied to the phase change layer 1 is closely related to an applying time of a set pulse and a reset pulse applied to a phase change memory cell. The applying time is also closely related to a retention time of data stored in a phase change memory cell.

Accordingly, by adjusting an applying time, i.e., the widths of applied set and reset pulses, of a set pulse and a reset pulse applied to a phase change memory cell during a write operation, a maintenance time of the resistivity of the phase change layer 1 corresponding to a crystalline state and the resistivity of the phase change layer 1 corresponding to an amorphous state may be adjusted. As a result, a retention time of data written in the phase change memory device 100 may be made shorter or longer.

For example, the phase change memory device 100 may apply a pulse during a volatile write mode VOL having a shorter applying time than a pulse applied to a phase change memory cell during a non-volatile write mode NONVOL. The pulse having a shorter applying time shortens a retention time of data written during the volatile write mode VOL. As a result, the phase change memory device 100 may be operable as a volatile memory, as well as a non-volatile memory.

Figure 4:
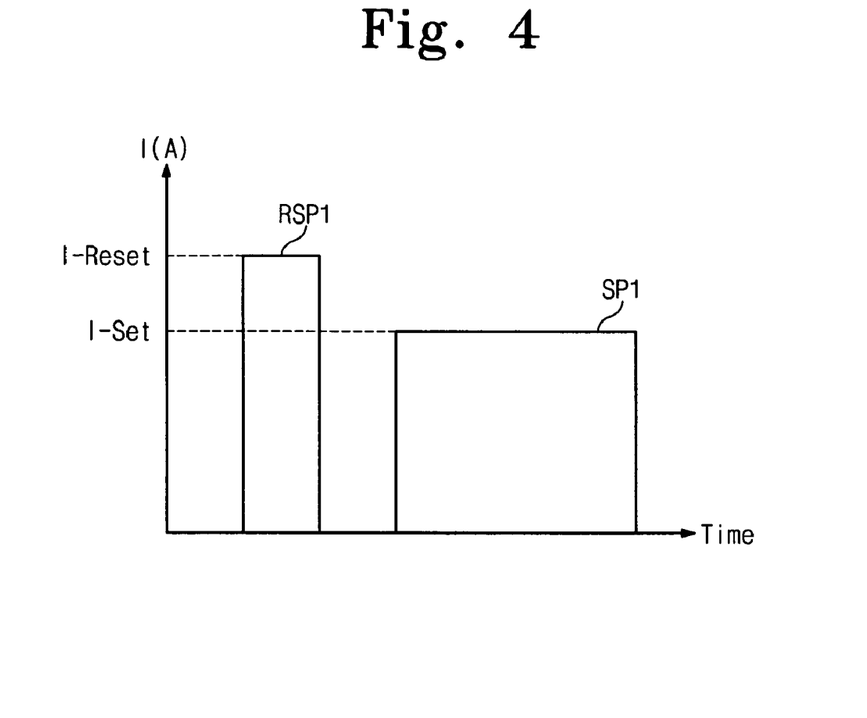
FIG. 4 illustrates waveforms of a set pulse and a reset pulse applied to write non-volatile data on a phase change memory cell in a non-volatile write mode.
Figure 5:
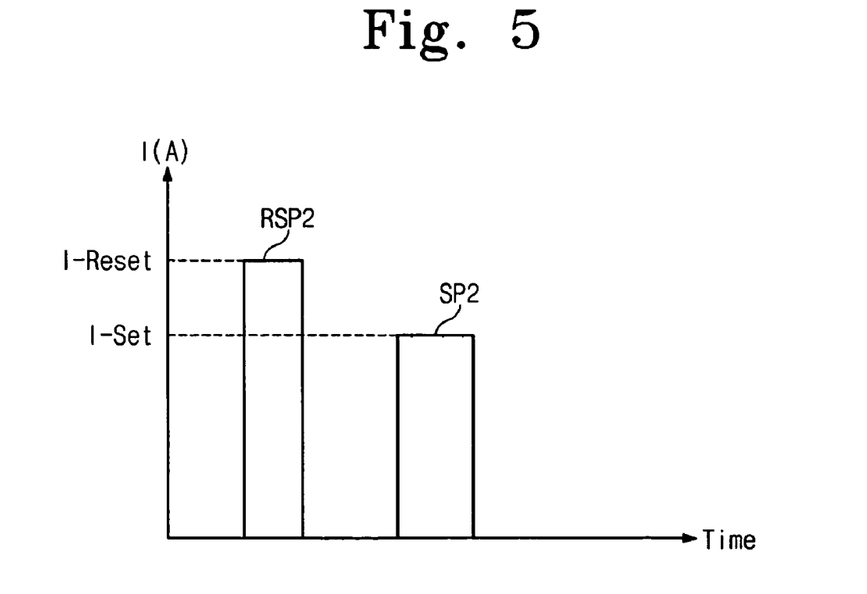
FIGS. 5 and 6 illustrates waveforms of a set pulse and a reset pulse applied to write volatile data on a phase change memory cell in a volatile write mode.
Figure 6:
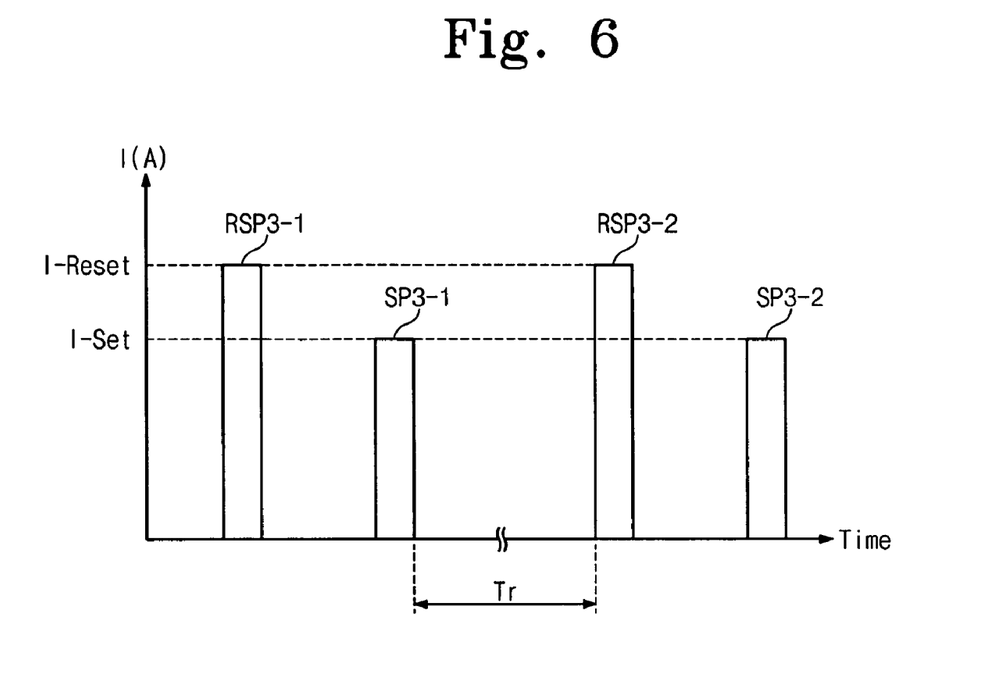

As specific examples of adjusting applying times, FIGS. 4 to 6 illustrate waveforms of set pulses and reset pulses applied during writing of non-volatile data, during a first write operation of volatile data, and during a second write operation of volatile data, respectively, to convert the phase change layer 1 of FIG. 2 into a reset state and a set state by joule heating. In FIGS. 4 to 6, an x-axis represents time and a y-axis represents current I.

FIG. 4 illustrates waveforms of a set pulse SP1 and a reset pulse RSP1 applied to write nonvolatile data on the phase change memory cell in the non-volatile write mode NONVOL. In order to make the phase change layer 1 be an amorphous state (i.e., a RESET state) in a non-volatile write mode NONVOL, as illustrated in FIG. 4, a reset pulse RSP1 may be applied for a short time, e.g., about 1 ns, and then removed. In order to make the phase change layer 1 be a crystalline state (i.e., a SET state), a set pulse SP1 is maintained for a predetermined time, e.g., 50 ns or more, and then removed.

Comparing current levels that represent an intensity of a current, a level of the reset pulse RSP1 is higher than that of the set pulse SP1. Comparing applying times of a current, an applying time of the set pulse SP1 is longer than that of the reset pulse RSP1. The applying times of the set pulse SP1 and the reset pulse RSP1 are determined by any one of types, component ratios, and doping methods of a phase change material constituting a phase change memory cell.

FIG. 5 illustrates waveforms of a set pulse SP2 and a reset pulses RSP2 applied during a first write operation of a volatile write mode VOL. Referring to FIG. 5, to make the phase change layer 1 be in a volatile amorphous state (i.e., a RESET state) during a first write operation of a volatile write mode VOL, a reset pulse RSP2 may be applied to a memory cell for a time shorter, e.g., about 1 ns or less, than a reset pulse RSP1 applied during a non-volatile write mode NONVOL, and then is removed. To make the phase change layer 1 be in a volatile crystalline state (i.e., a SET state) during a first write operation of a volatile write mode VOL, a set pulse SP2 is applied to a memory cell for a time, e.g., about 10 ns to about 20 ns, shorter than a set pulse SP1 applied during a non-volatile write mode NONVOL, and then is removed.

The first write operation is an operation for writing volatile data a first time on a phase change memory device. In the first write operation, an applying time of the set pulse SP2 may be longer than that of the reset pulse RSP2.

An applying time of the set pulse SP2 and the reset pulse RSP2 may be determined by at least one of types, component ratios, and doping methods of a phase change materials constituting a phase change memory cell. For example, if the phase change material includes an In—Sb—Te material, an applying time of the set pulse SP2 may be about 10 ns.

FIG. 6 illustrate waveforms of set pulses, SP3-1 and SP3-2, and reset pulses, RSP3-1 and RSP3-2, applied during a second write operation of a volatile write mode VOL. To rewrite the phase change layer 1 to be a volatile amorphous state (i.e., a RESET state) during a second write operation of a volatile write mode VOL, the reset pulse RSP3-1 may be applied to a memory cell during a time shorter than a reset pulse RSP2 applied during a first write operation and then is removed. To rewrite the phase change layer 1 to be a volatile crystalline state (i.e., a SET state) during a second write operation of a volatile write mode VOL, the set pulse SP3-1 may be applied to a memory cell during a time shorter than a set pulse SP2 applied during a first write operation, and then is removed.

An applying time of the reset pulse RSP3-$j$ and the set pulse SP3-$j$ (j is a positive integer) may be determined by at least one of types, component ratios, and doping methods of a phase change material constituting the phase change memory cell. For example, if the phase change material includes an In—Sb—Te material, an applying time of the reset pulse RSP3-$j$ may be less than about 10 ns.

The second write operation is an operation for rewriting corresponding data to maintain volatile data stored in the phase change memory device. The second write operation may be repeatedly performed by a predetermined time Tr (e.g., at least 1000 s). An applying time and an applying period of the reset pulse RSP3-$j$ and the set pulse SP3-$j$ (j is a positive integer) applied during the second write operation may have a predetermined value regardless of the number of repeating second write operations, or may vary (e.g., increase or decrease) according to the number of times the second write operation has been repeated.

Embodiments may rewrite data by a predetermined time period to maintain the volatile data. However, the phase change memory device 100 may have a longer data retention time for volatile data than other volatile memory devices.

Accordingly, periods between rewrite operations performed in the phase change memory device 100 may be longer than those of other volatile memory devices. Therefore, power consumption due to a data rewrite operation may be less than other volatile memory devices.

Figure 7:
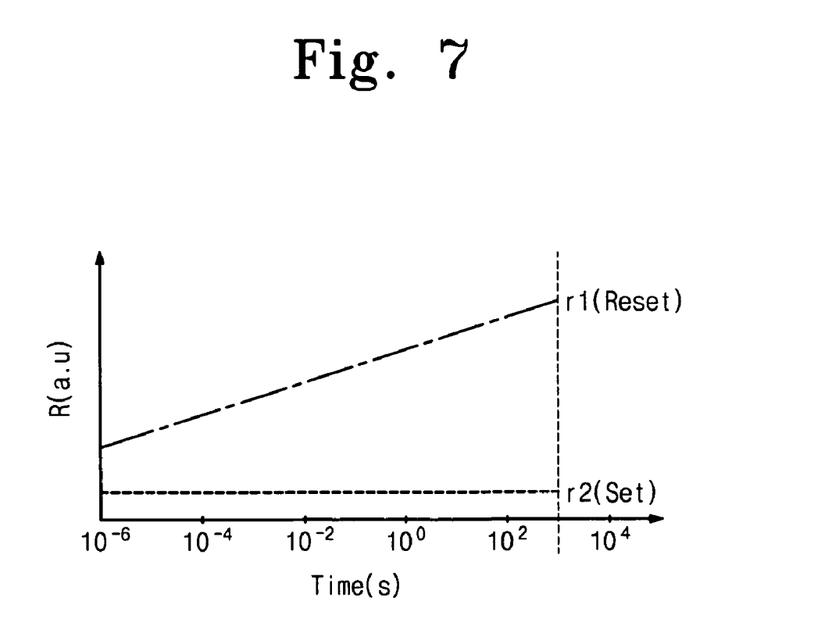
FIG. 7 illustrates a graph of a resistance characteristic according to a time of a phase change memory.

FIG. 7 illustrates a graph of a resistance characteristic according to a time of a phase change memory. In FIG. 7, an x-axis represents a time and a y-axis represents a resistance R.

The graph of FIG. 7 illustrates each of a reset resistance r1 and a set resistance r2 of a phase change memory cell when the phase change memory cell formed of a GST phase change material is written with data using a relative short pulse of less than 50 ns at 90° C. As illustrated in FIG. 7, if data are written using the relative short pulse of less than 50 ns at 90° C., there is no data loss until 1000 s.

This allows data to be maintained at least for about 1000 s if the phase change memory device 100 writes data to be volatile by shortening an applying time of a write pulse. That time between rewrite operations of the phase change memory device 1000 may be longer than those of typical volatile memory devices (e.g., DRAM, etc.). This operating characteristic may reduce current consumption (or power consumption) caused by repeatedly performing a rewrite operation in the phase change memory device 100 compared to typical volatile memory devices. Due to lower current consumption (or power consumption), the phase change memory device 100 may be usefully applied to portable information devices such as a mobile phone, a personal digital assistant (PDA), digital camera, a camcorder, a voice recorder, an MP3 player, a personal portable terminal, a handheld PC, a game console, etc.

The graph of FIG. 7 illustrating a write characteristic of a phase change memory cell formed of a GST phase change material is just one example. For example, if at least one of types, component ratios, and doping methods of a phase change material constituting a phase change memory is changed, a resistance characteristic according to a time of a phase change memory device may vary in diverse forms. Moreover, an applying time (i.e., the width of a write pulse) and a period of each write pulse applied for performing non-volatile and volatile write operations of the phase change memory device may vary in diverse forms.

Figure 8:
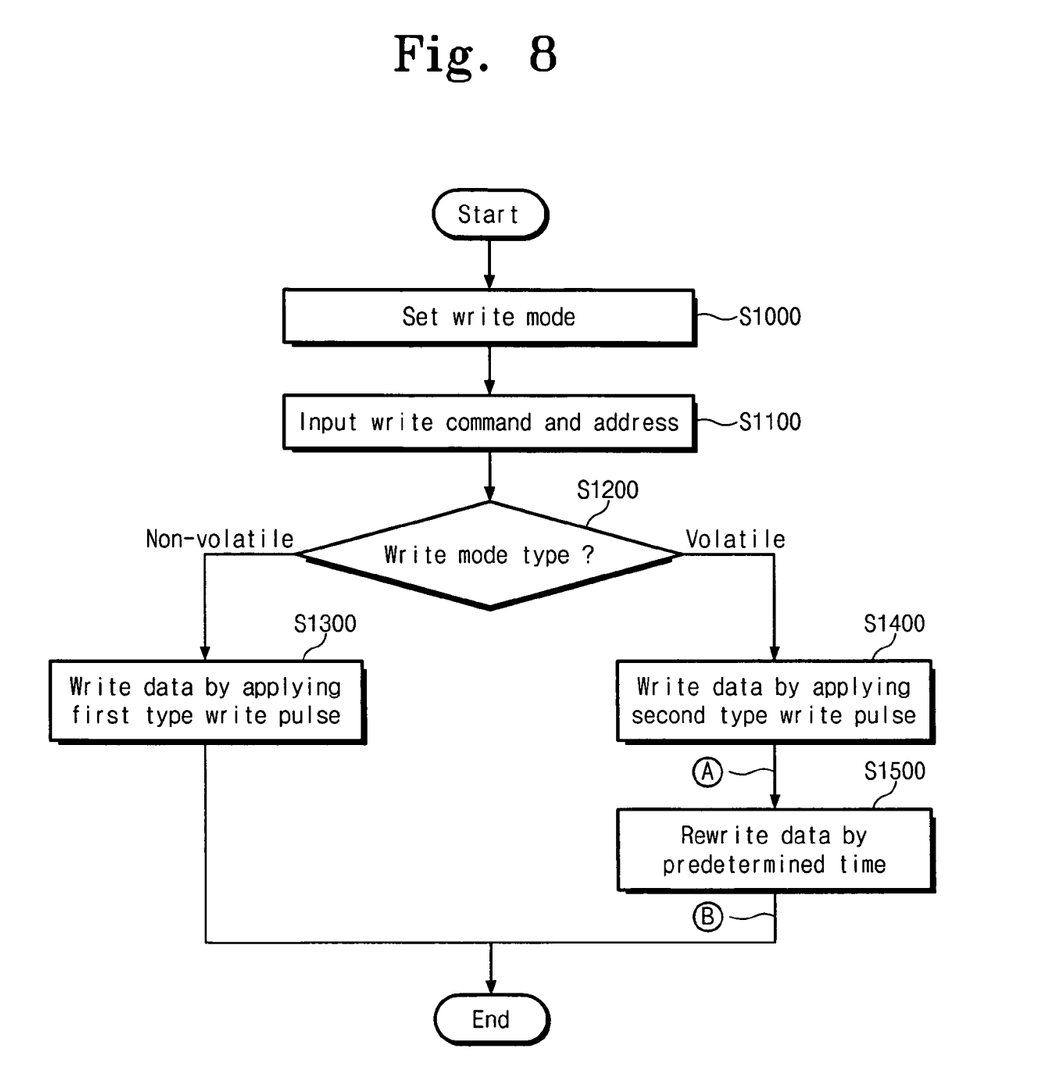
FIG. 8 illustrates a flowchart of a data write method of a phase change memory device according to an embodiment.

FIG. 8 illustrates a flowchart of a data write method of the phase change memory device 100 according to the present invention.

Referring to FIG. 8, the phase change memory device 100 may set up a write mode according to a control of a controller or a host in operation S1000. The write mode may be divided into a volatile write mode VOL and a non-volatile write mode NONVOL. The volatile write mode VOL may be divided into a first write operation for writing volatile data on a phase change memory cell and a second write operation for rewriting the volatile data written during the first write operation after a predetermined time period. A write command and an address may be input from a host in operation S1100. A type of write mode to be performed may then be determined in operation S1200.

According to a determination result of operation S1200, if the set write mode is a non-volatile write mode NONVOL, a write pulse of a first type may be applied to a memory cell to write data in operation S1300. The first type write pulse may be a set pulse SP1 and a reset pulse RSP1 for writing data on a memory cell to be non-volatile. An exemplary form of the first type write pulse is illustrated in FIG. 4.

According to a determination result of operation S1200, if the set write mode is the volatile write mode VOL, a write pulse of a second type is applied to write data in operation S1400. Then, the data written during operation may be is rewritten after a predetermined time in operation S1500. The rewrite operation of operation S1500 may be repeatedly performed after a predetermined time period. The write operations during operations S1400 and S1500 may be performed in the write driver 141 in response to a control of the control logic 150.

The write operation during operation S1400 may be a first write operation of the volatile write mode VOL and the write operation during operation S1500 may be a second write operation of the volatile write mode VOL. The second type write pulse of operation S1400 is the set pulse SP2 and the reset pulse RSP2 for writing data to a memory cell to be volatile. An exemplary waveform of the second type pulse is shown in FIG. 5.

Figure 9:
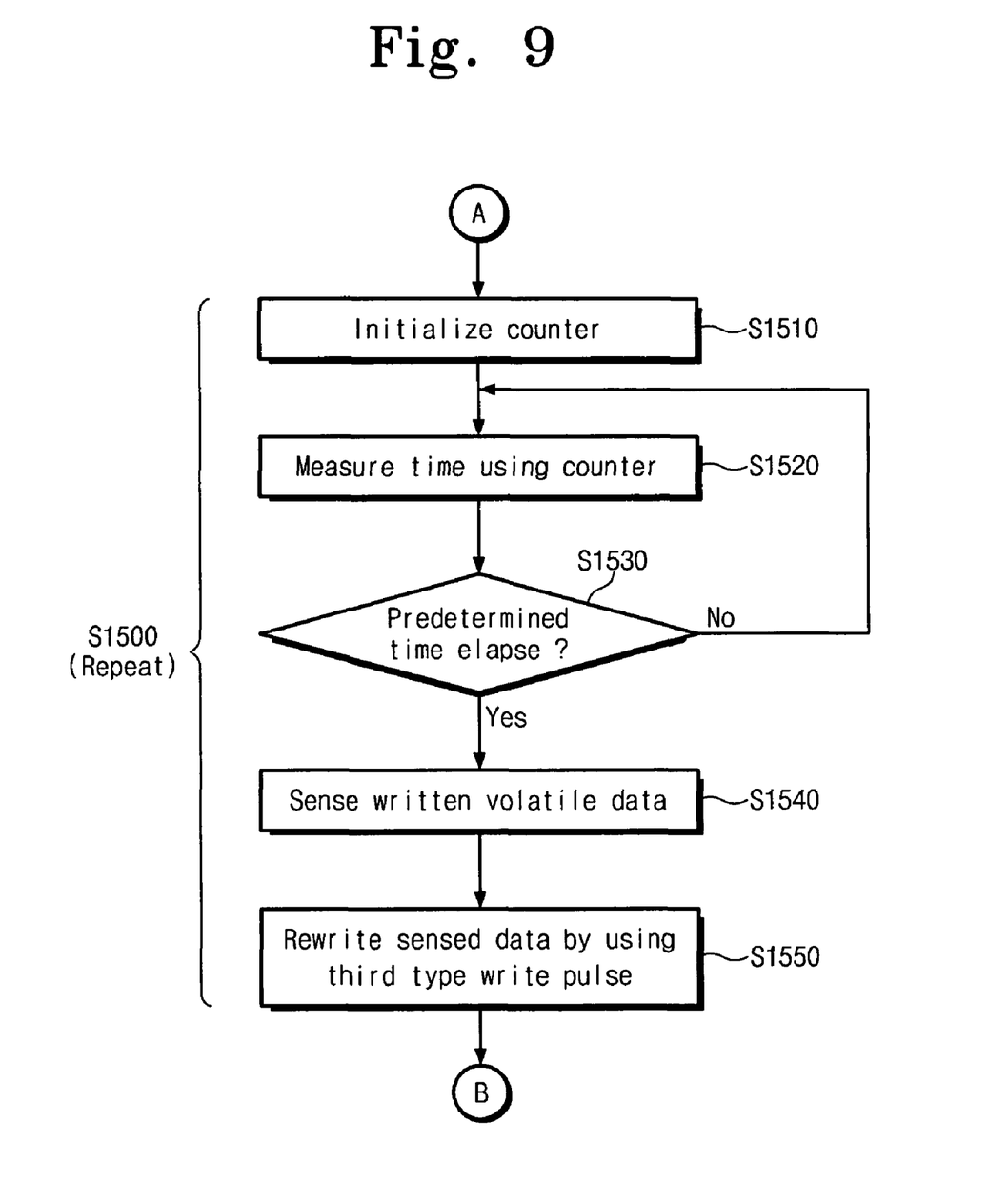
FIG. 9 illustrates a flowchart of operation S1500 of FIG. 8 (i.e., a second operation of a volatile write mode)

FIG. 9 illustrates a flowchart of operation S1500 of FIG. 8, i.e., the second operation of the volatile write mode VOL. Referring to FIG. 9, to perform a second write operation of a volatile write mode VOL, a counter (not shown) in the control logic 150 may be initialized in operation S1510. Then, time may be measured using the initialized counter in operation S1520. For example, the counter may be configured to count time by counting a number of activated clocks after performing a reset operation. Then, based on the measurement result of a time in operation S1520, whether a predetermined time has elapsed or not may be determined in operation S1530.

If the predetermined time has not elapsed, flow may return to operation S1520 and continue to measure time. When the predetermined time has elapsed, the volatile data written during operation S1400 may be detected in operation S1540. The data detection may be performed in a sense amplifier 145 in response to a control of the control logic 150. The data detected in the sense amplifier 145 may not be externally output, but are provided into the write driver 141 in the phase change memory device 100. The write driver 141 may rewrite the data provided from the sense amplifier 145 to a memory cell using a third type write pulse of in operation S1550.

Operations S1510 through S1550 may be repeatedly performed after a predetermined time period.

The third type write pulse used in operation S1550 is set pulses, SP3-1 and SP3-2, and reset pulses, RSP3-1 and RSP3-2, for rewriting volatile data on a memory cell. An exemplary form of the third type pulse is illustrated in FIG. 6.

As illustrated in FIGS. 4 through 6, according to types of a data write mode, an applying time of a set pulse SPj and a reset pulse RSPj (j is a positive integer) varies. For example, an applying time of a second type write pulse may be shorter than that of a first type write pulse, and an applying time of the third type write pulse may be shorter than that of a second type write pulse. Additionally, an applying time and an applying period of the third type write pulse may vary according to the number of repeating rewrite operations. An applying time of the first to third type write pulses may be determined by at least one of types, component ratios, and doping methods of a phase change material constituting a phase change memory cell.

Figure 10:
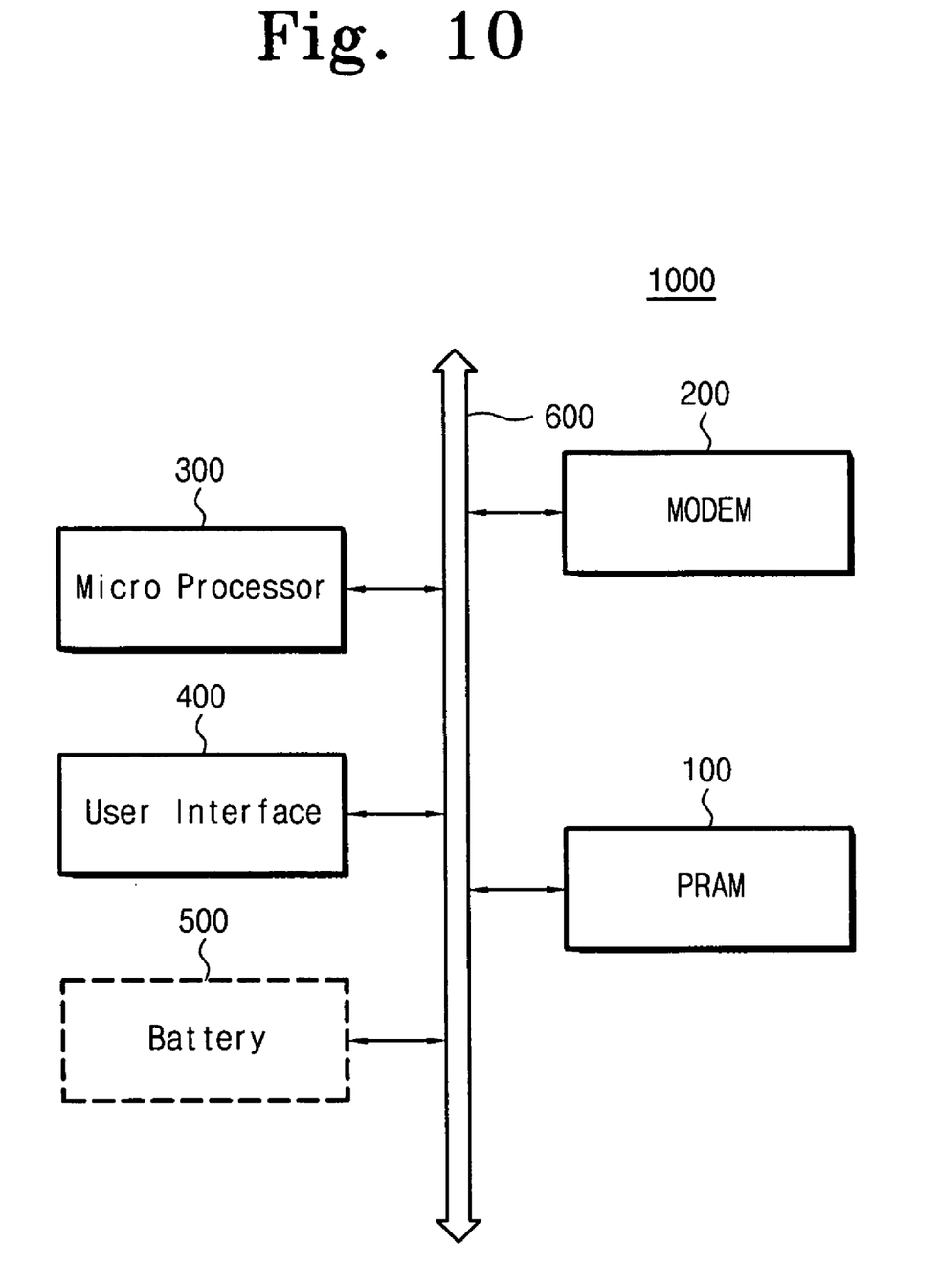
FIG. 10 illustrates a view of a structure of a system to which a phase change memory device of an embodiment may be applied.

FIG. 10 illustrates a block diagram of a system 1000 to which the phase change memory device 100 according to embodiments may be applied. Referring to FIG. 10, the system 1000 may be a computing system, a mobile device, etc. Moreover, the system 1000 may include home applications, e.g., HDTV, DVD, a router, GPS, etc.

The system 1000 may include a phase change memory device (shown as PRAM) 100, a modem 200, e.g., a baseband chipset, a microprocessor 300, and a user interface 400, which may be electrically connected through a bus 600. The microprocessor 300 may serve as a controller to control the phase change memory device 100 according to a request of a host.

The phase change memory device 100 of FIG. 10 may be realized with a phase change memory device having the same structure and write method according to embodiments. As mentioned above, the phase change memory device 100 may perform volatile and non-volatile data write operations. The phase change memory device 100 may rewrite written volatile data by a predetermined time period in order to maintain data retention characteristics if the data is written as volatile. According to embodiments, although an applying time when a write current is applied to rewrite data may be short, a period between applying a write current for rewriting the data may be long. Therefore, a fast data write speed and low power consumption may be achieved. Accordingly, the phase change memory device may store, e.g., both codes and data, without difficulty, and may be more usefully applied to a system requiring volatile and non-volatile data write characteristics.

The phase change memory device 100 may store N-bit data (N is equal to or greater than 1) processed/to be processed by the microprocessor 300 or the host. If the system 1000 is a mobile device, a battery 500 may be additionally provided to supply an operating voltage of the system 1000. Although not illustrated in the drawings, it is apparent to those skilled in the art that additional elements, e.g., an application chipset, a camera image processor (CIS), a mobile DRAM, a NAND flash memory device, etc., may be further provided to the system 1000.

If the phase change memory device 100 is operated by a limited power source, e.g., a battery 500, the system 1000 of FIG. 10 may additionally perform the following data rewrite method.

Figure 11:
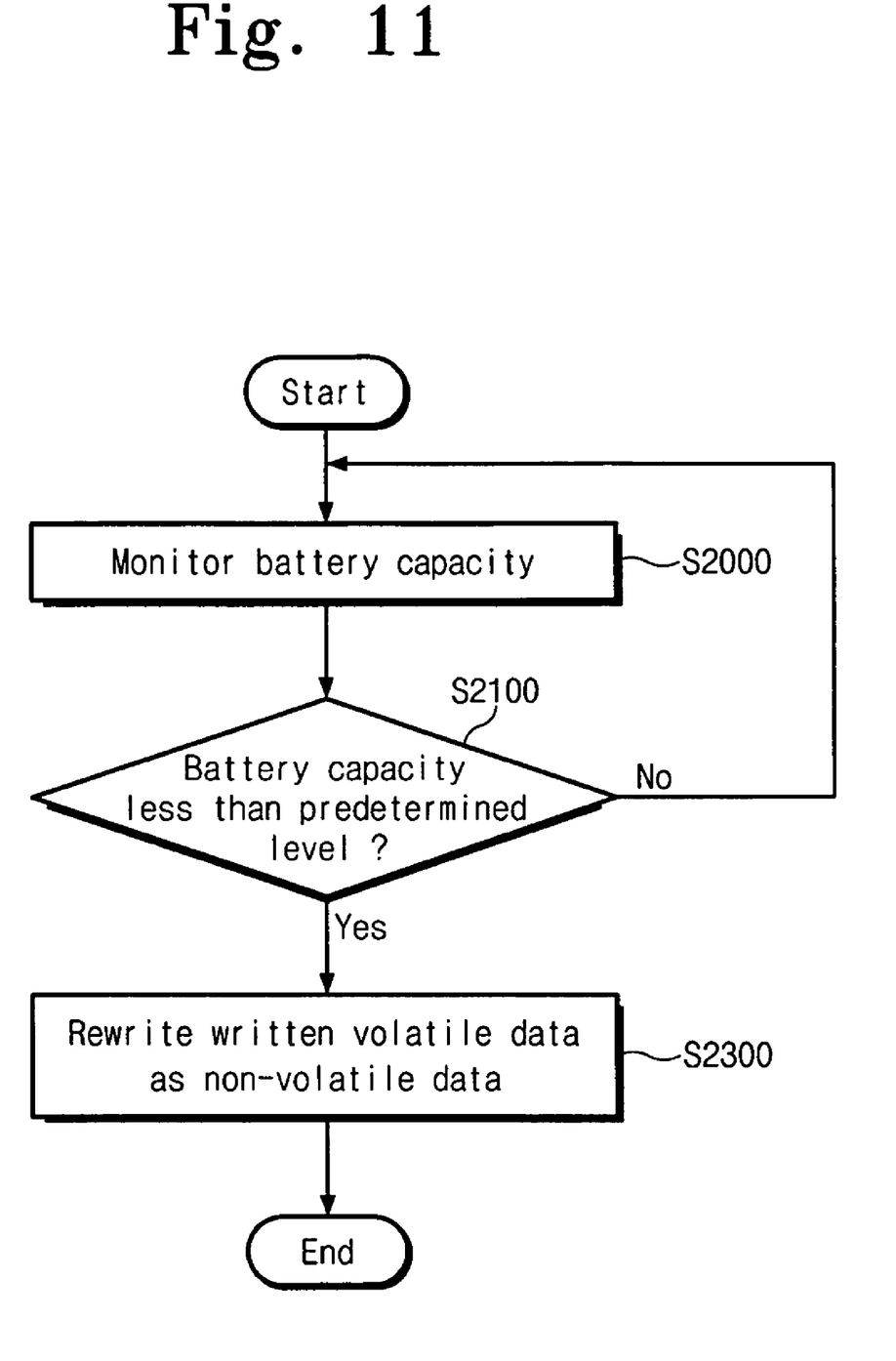
FIG. 11 illustrates a flowchart of a data rewrite method of a system including a phase change memory device of an embodiment.

FIG. 11 illustrates a flowchart of a data rewrite method of the system 1000 including the phase change memory device 100 according to embodiments.

Referring to FIG. 11, while the system 1000 is turned on, a capacity of the battery 500 (i.e., a power source supplier) may be monitored in operation S2000. Then, whether a capacity of the monitored battery 500 is below a predetermined capacity or not maybe determined in operation S2100.

According to a determination result of operation S2100, if the capacity of the battery 500 is not below a predetermined capacity, flow may return to operation S2000 and continuously monitors the capacity of the battery 500. If the capacity of the monitored battery 500 is below the predetermined capacity, the data written as volatile may be rewritten as non-volatile in operation S2300. A write pulse used in operation S2300 may be the first type write pulse of FIG. 4. According to such a data rewrite operation, even if there is no power source from the limited power source, data loss may not occur. Therefore, after rebooting, a discontinued operation may continue to be performed. The above-mentioned operations may be controlled by the control logic 150 in the phase change memory device 100 or the microprocessor 400 outside the phase change memory device 100.

According embodiments, both volatile data and non-volatile data may be written to a phase change memory device. The phase change memory device may have a short time for applying a write current and a long period for reapplying a write current. Accordingly, a data writing speed may increase and less power may be consumed.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A write method of a phase change memory device, the method comprising:
    setting a write mode as one of a volatile write mode and a non-volatile write mode;
    writing data as volatile or non-volatile on a phase change memory cell of the phase change memory device by applying a write pulse corresponding to the write mode, the write pulse provided in the phase change memory cell being determined to be a write reset pulse or a write set pulse in accordance with the data value to be written,
    wherein writing data includes:
        writing non-volatile data in the non-volatile write mode by applying a first write pulse, and
        writing volatile data in the volatile write mode by applying a second write pulse,
        the first write pulse and the second write pulse are determined to both be the write reset pulse or the write set pulse in accordance with the data value to be written, and
        the second write pulse having a shorter width than the first width pulse,
    wherein, when power is not supplied to the phase change memory device the non-volatile data is retained and the volatile data is not retained;
    monitoring a capacity of a battery, the battery configured to supply power to the phase change memory device; and
    rewriting written volatile data as non-volatile data when the capacity of the battery is below a predetermined level.

2. The method as claimed in claim 1, wherein writing volatile data further comprises rewriting written volatile data after a predetermined time.

3. The method as claimed in claim 2, wherein rewriting written volatile data comprises applying a third write pulse, the third write pulse having a shorter width than the second write pulse.

4. The method as claimed in claim 3, comprising varying at least one of a width and a period between third write pulses according to a number of times rewriting written volatile data has been repeated.

5. The method as claimed in claim 3, wherein widths of the first to third write pulses are determined by at least one of types, component ratios, and doping methods of a phase change material included in the phase change memory cell.

6. The method as claimed in claim 3, wherein rewriting written volatile data comprises:
   initializing a counter;
   measuring time using the counter;
   sensing the written volatile data when the measured time exceeds a predetermined time; and
   rewriting the sensed data using the third write pulse.

7. A phase change memory device, comprising:
   an array including a plurality of phase change memory cells;
   a control logic configured to generate one of a first write pulse and a second write pulse, the first write pulse and the second write pulse being determined to be a write reset pulse or a write set pulse in accordance with data values to be written, the first write pulse writing data to a phase change memory cell as non-volatile data and the second write pulse writing data to the phase change memory cell as volatile data, the first write pulse and the second write pulse are determined to both be the write reset pulse or the write set pulse in accordance with the data value to be written, and the second pulse having a shorter width than the first write pulse; and
   a write read circuit configured to apply one of the first and second write pulses to the phase change memory cell in response to an output of the control logic, wherein, when power is not supplied to the phase change memory device, the non-volatile data is retained and the volatile data is not retained, wherein:
   the control logic is configured to control rewriting written volatile data as non-volatile data when a capacity of a battery supplying power to the phase change memory device is less than a predetermined level.

8. The phase change memory device as claimed in claim 7, wherein the control logic is configured to generate a third write pulse, the third write pulse rewriting written volatile data after a predetermined time.

9. The phase change memory device as claimed in claim 8, wherein the write read circuit is configured to sense the written volatile data in response to an output of the control logic and rewrite the sensed data on the phase change memory cell by applying the third write pulse.

10. The phase change memory device as claimed in claim 8, wherein the third write pulse has a shorter width than the second write pulse.

11. The phase change memory device as claimed in claim 8, wherein a controller is configured to vary at least one of a width of the third pulse and the predetermined time according to a number of times rewriting written volatile data has been repeated.

12. The phase change memory device as claimed in claim 8, wherein applying times of the first to third write pulses are determined by at least one of types, component ratios, and doping methods of a phase change material included in the phase change memory cell.

13. The phase change memory device as claimed in claim 8, wherein the control logic is configured to manage mapping information of data written in the phase change memory device and control rewriting written volatile data based on the mapping information.

14. The phase change memory device as claimed in claim 7, wherein the phase change memory cell comprises a phase change material of GST, the GST including a composition of Ge, Te, and Sb.

15. The phase change memory device as claimed in claim 7, wherein the phase change memory cell comprises a combination of at least one of Te and Se and at least one of Ge, Sb, Bi, Pb, Sn, Ag, As, S, Si, P, O, and N.

16. The phase change memory device as claimed in claim 7, wherein the phase change memory cell comprises a combination of at least one of Ge—Sb—Te, As—Sb—Te, As—Ge—Sb—Te, Sn—Sb—Te, Ag—In—Sb—Te, In—Sb—Te, 5A-group element-Sb—Te, 6A-group-Sb—Te, 5A-group element-Sb—Se and 6A-group element-Sb—Se.

* * * * *